(12) United States Patent
Hopsecger

(10) Patent No.: US 7,205,818 B2
(45) Date of Patent: Apr. 17, 2007

(54) CURRENT LOOP DRIVE MODULE WITH DYNAMIC COMPLIANCE VOLTAGE

(75) Inventor: Edward C. Hopsecger, Mentor, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 198 days.

(21) Appl. No.: 10/955,814

(22) Filed: Sep. 30, 2004

(65) Prior Publication Data

US 2006/0066379 A1   Mar. 30, 2006

(51) Int. Cl.
*H03K 5/08* (2006.01)
*H03L 5/00* (2006.01)

(52) U.S. Cl. ........................................... 327/323
(58) Field of Classification Search ................ 327/306, 327/316, 323, 332, 343

See application file for complete search history.

(56) References Cited

U.S. PATENT DOCUMENTS

| | | | | |
|---|---|---|---|---|
| 5,267,138 A | * | 11/1993 | Shores | .......................... 363/98 |
| 5,838,515 A | * | 11/1998 | Mortazavi et al. | ........ 360/78.12 |
| 6,853,174 B1 | * | 2/2005 | Inn | ............................. 323/285 |
| 2005/0275392 A1 | * | 12/2005 | Wong et al. | ................. 323/283 |

* cited by examiner

*Primary Examiner*—My-Trang Nu Ton
(74) *Attorney, Agent, or Firm*—Keith M. Baxter; R. Scott Speroff

(57) ABSTRACT

A current loop drive module includes a drive circuit and a compliance voltage controller. The drive circuit is configured to receive a compliance voltage and operable to generate a current loop signal based on the compliance voltage for receipt by an associated load coupled to the drive circuit. The compliance voltage controller is operable to adjust the compliance voltage based on the associated load. A method for generating a current loop signal includes generating a current loop signal based on a compliance voltage for receipt by an associated load and adjusting the compliance voltage based on the associated load.

32 Claims, 3 Drawing Sheets

CURRENT LOOP DRIVE MODULE WITH DYNAMIC COMPLIANCE VOLTAGE

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to current loop driving circuits and, more particularly, to a current loop drive module with a dynamic compliance voltage.

In general, two wire, loop circuits are used to provide signals for a variety of devices, for example, valve actuators or meters. Loop circuits typically include a current loop driving circuit which varies the current in the loop, generally from 0 to 20 mA, according to a received driving signal. For example, when the loop circuit is used to control a valve actuator, a controller provides a voltage proportional to the current that should be supplied to the controlled actuator. A current loop drive circuit, including a voltage-to-current converter that may contain a current mirror circuit, generates the 0–20 mA signal based on the received voltage.

The voltage supply provided to the current loop drive circuit, commonly referred to as the compliance voltage, is selected such that it is sufficient to drive the current loop signal across the range of expected loads. For example, the loads may range in resistance from ~750 ohms for a solenoid valve to ~0 ohms for a panel meter. To provide adequate range, typical loop driving circuits are provided with compliance voltage sources of approximately 24V.

The power dissipated in the current loop system is determined by the current signal and the compliance voltage (i.e., $P=0.02\ A \times 24V = 0.48\ W$), not the resistance of the load. In cases where the load has a relatively low resistance, most of the power is dissipated as heat in the current loop drive circuit and not the load. Typical drive modules include circuitry for controlling multiple current loop channels. Due to the potential for significant power dissipation in the drive module, the number of channels a drive module can support for a given volume is limited. Also, the components used in the drive circuitry must be sized appropriately to handle the heat.

Given the restrictions imposed by the power dissipation requirements, it is difficult to reduce the cost per channel and increase the density of the analog outputs. The number of channels provided in a given module is typically limited based on the worst case power dissipation scenario. Alternatively, a user may be provided with guidelines that allow the determination of acceptable loads for a given compliance voltage and the number of loads that may be simultaneously active. Such restrictions limit the range of applications that may be served by a drive module. If a lower compliance voltage is provided, sufficient voltage may not be present to drive the current loop signal over its full range. Increasing the compliance voltage increases the range, but limits the number of channels for a given volume.

Therefore, there is a need for a current loop drive module that has adequate range to drive a variety of load types, but that can reduce the power dissipated in the drive module to allow a higher channel density.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The present inventors have recognized that a current loop drive module may be constructed with a dynamic compliance voltage that adjusts based on the nature of the driven load to reduce the amount of power dissipated in the drive module. Reducing the power dissipated in the drive module allows for higher channel density and reduced system cost.

One aspect of the present invention is seen in a current loop drive module including a drive circuit and a compliance voltage controller. The drive circuit is configured to receive a compliance voltage and operable to generate a current loop signal based on the compliance voltage for receipt by an associated load coupled to the drive circuit. The compliance voltage controller is operable to adjust the compliance voltage based on the associated load.

Another aspect of the present invention is seen in a method for generating a current loop signal. The method includes generating a current loop signal based on a compliance voltage for receipt by an associated load. The compliance voltage is adjusted based on the associated load.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE SEVERAL VIEWS OF THE DRAWINGS invention will hereafter be described with reference to the accompanying drawings, wherein like reference numerals denote like elements, and:

DETAILED DESCRIPTION OF THE INVENTION

One or more specific embodiments of the present invention will be described below. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
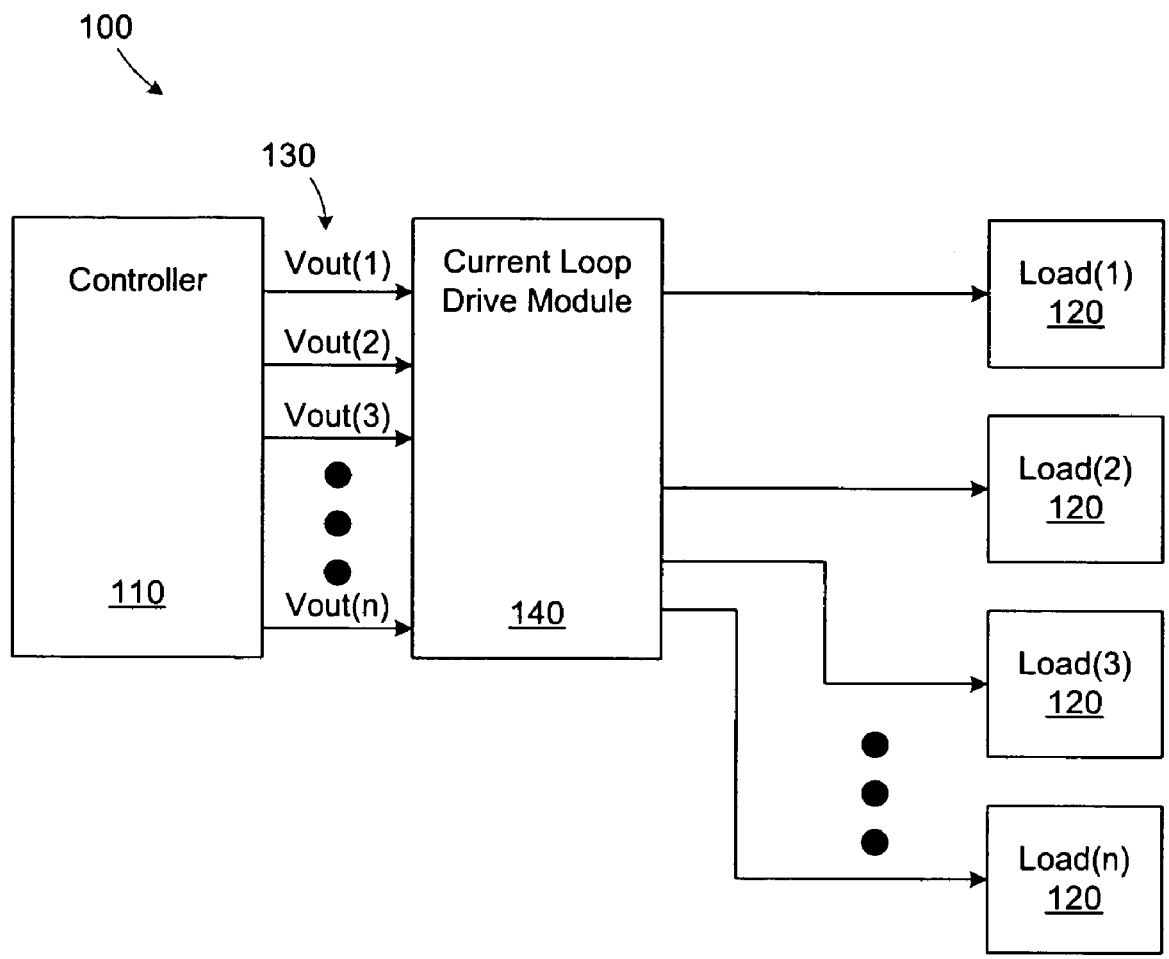
FIG. 1 is a schematic diagram of a control system in accordance with one embodiment of the present invention.

Referring now to the drawings wherein like reference numbers correspond to similar components throughout the several views and, specifically, referring to FIG. 1, the present invention shall be described in the context of a control system 100. The control system 100 includes one or more controllers 110 providing signals to control one or more loads 120, each load 120 having an associated channel 130. The loads 120 may vary widely depending on the particular implementation. For example, the loads 120 may be solenoid valves, valve actuators, panel meters, etc. Generally, the controller 110 generates an output drive signal (Vout) for each load 120 to affect a positioning thereof. Although a unitary controller 110 is illustrated, separate controllers 110 may be used. In one example, the control system 100 may be used to control a multi-axis machine, with each channel 130 being associated with a different control axis. The controller 110 may have a local connection to the current loop drive module 140, or it may communicate over a communication network with the current loop drive module 140. For example, the controller 110 may be a networked computer workstation.

In the illustrated embodiment, the control system 100 uses current loop signals for communicating with the loads 120. A current loop drive module 140 receives the output drive signal from the controller 110 and generates a current loop signal (e.g., 0–20 mA) where the magnitude of the current is proportional to the magnitude of the output drive signal. For example, a 20 mA signal may indicate that a valve actuator should be in a fully open position, while a 0 mA signal indicates a fully closed position. Intermediate current values correspond to various intermediate valve positions. In the case of a panel meter, the current signal corresponds to the deflection of the meter.

Figure 2:
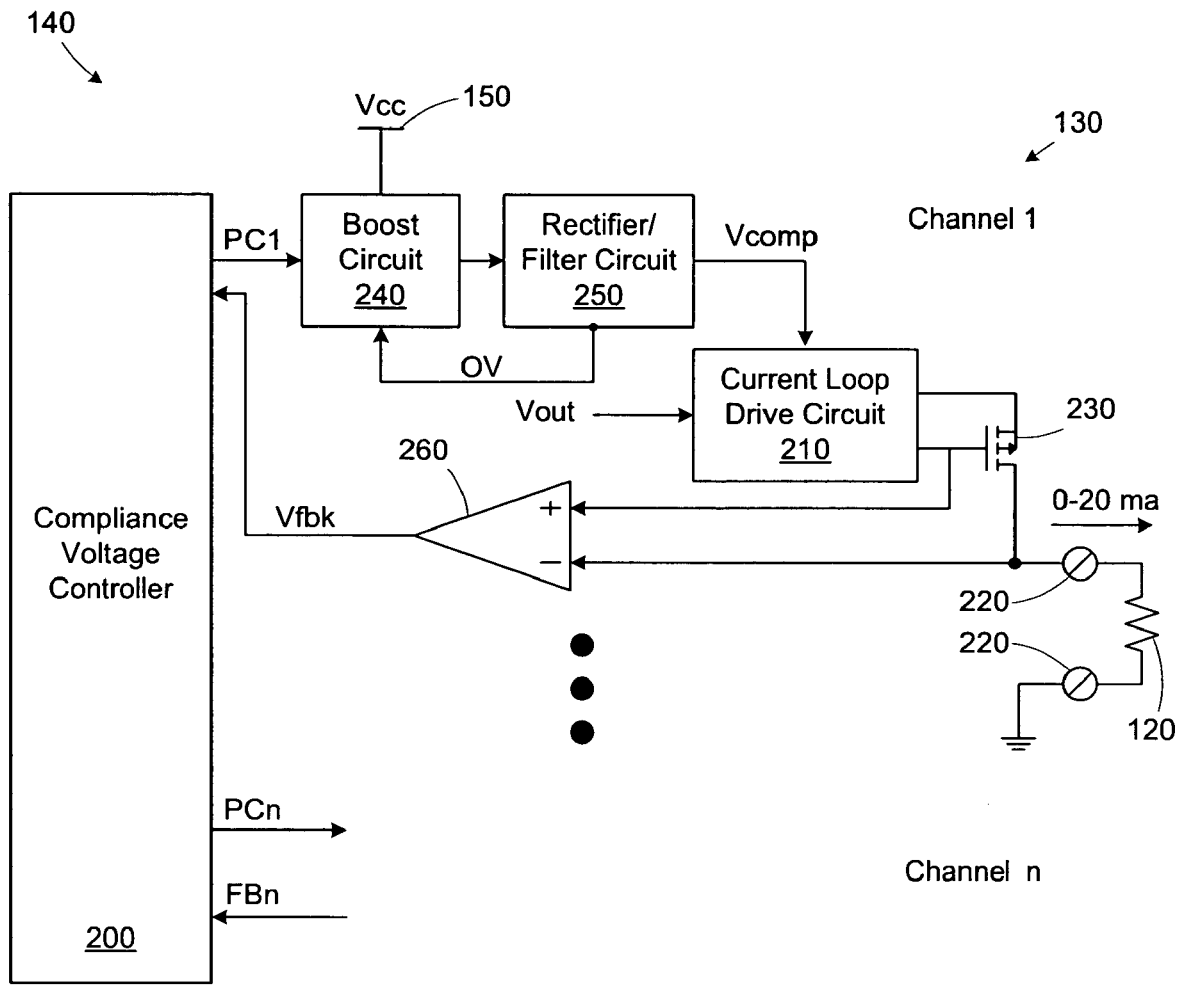
FIG. 2 is a simplified block diagram of a current loop drive module in the control system of FIG. 1.

Turning now to FIG. 2, a simplified block diagram of the current loop drive module 140 is provided. The current loop drive module 140 includes a plurality circuit components for each channel for driving the multiple current loop circuits. In the illustrated embodiment, the current loop drive module 140 supports 12 channels. As each channel 130 uses similar circuitry, only one channel 130 is described in detail. The current loop drive module 140 includes a compliance voltage controller 200 shared across the channels 130. However, the compliance voltage controller 200 may generate a different compliance voltage for each channel 130. A current loop drive circuit 210 receives the output drive signal (Vout) from the controller 110 (see FIG. 1) for its associated channel 130. The load 120 is coupled to the current loop drive module 140 at terminals 220. The current loop drive circuit 210 generates the current loop signal (0–20 mA) for the load 120 at a transistor 230. The construction and operation of the current loop drive circuit 210 are well known to those of ordinary skill in the art, so they are not described in detail herein. For example, a current mirror circuit may be used.

The compliance voltage (Vcomp) generated by the compliance voltage controller 200 is received by the current loop drive circuit 210. Generally, the magnitude of the compliance voltage determines the amount of current the current loop drive circuit 210 can generate for a given load resistance. A lower load resistance equates to a lower compliance voltage requirement to drive the current loop signal, while a higher load resistance requires a higher compliance voltage to drive the current loop signal.

The voltage associated with the current loop signal is dropped across the load 120 and the transistor 230. If the load resistance is near zero, for example, with a panel meter load, essentially the entire compliance voltage is dropped across the transistor 230, resulting in significant heat dissipation in the current loop drive module 140. As described in greater detail below, the compliance voltage controller 200 dynamically adjusts the compliance voltage based on the observed characteristics of the load 120 to reduce the amount of power dissipated in the current loop drive module 140 while still maintaining the capacity to drive the current loop signal for the load 120.

The compliance voltage controller 200 provides a control signal (PC1) to a boost circuit 240 that generates an input for a rectifier/filter circuit 250. The boost circuit 240 and rectifier/filter circuit 250 boost the supply voltage (e.g., 6V) to generate a boost voltage. The rectifier/filter circuit 250 receives the boost voltage, rectifies the boost voltage, and filters the boost voltage to generate the compliance voltage for the current loop drive circuit 210. A comparator 260 compares the voltage at the transistor 230 to the voltage at the load 120 to determine the relative requirements of the load 120 and generates a digital feedback voltage (Vfbk) for the compliance voltage controller 200. The voltage at the transistor 230 represents the compliance voltage less the gate-to-source voltage of the transistor 230 and sense resistor contained within the current loop drive circuit 210.

The comparator 260 has analog inputs and a digital output. The comparator 260 outputs a logic "1" if the voltage at the transistor 230 is greater than the voltage at the load 120 and a logic "0" otherwise. If more voltage is dropped across the transistor 230 (i.e., logic 1), the compliance voltage can be lowered without the current loop drive circuit 210 losing the capacity to drive the current loop signal. If the voltage at the transistor 230 drops below the voltage at the load (i.e., logic 0), the compliance voltage controller 200 increases the compliance voltage.

Figure 3:
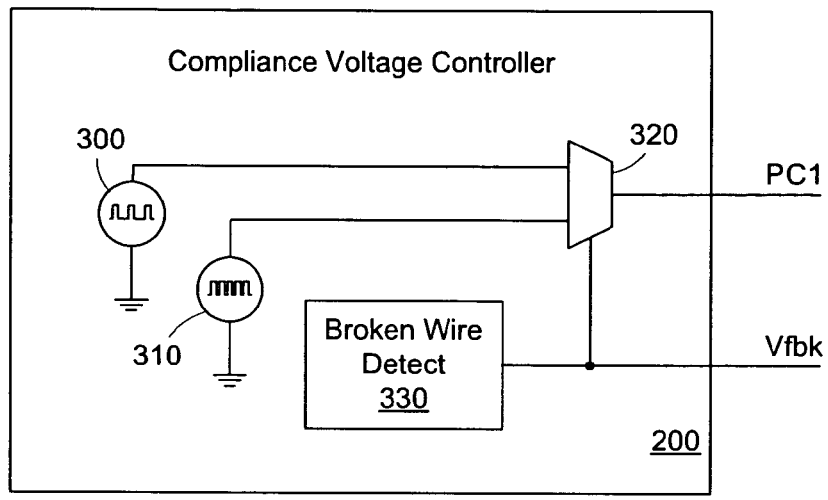
FIG. 3 is a simplified block diagram of a compliance voltage controller in the current loop drive module of FIG. 2.

Turning now to FIG. 3, a simplified block diagram of the compliance voltage controller 200 is provided. In the illustrated embodiment, the compliance voltage controller 200 is implemented using a programmable logic device configured to implement the functions described herein. The compliance voltage controller 200 includes waveform generators 300, 310 that generate waveforms to be provided to the boost circuit 240 to affect the magnitude of the compliance voltage. The specific waveforms may vary widely depending on the particular implementation. In the illustrated embodiment, the waveform generator 300 generates a 10% duty cycle square wave that serves to drop the compliance voltage when applied to the boost circuit 240, and the waveform generator 310 generates a 70% duty cycle square wave that serves to increase the compliance voltage when applied to the boost circuit 240. A multiplexer 320 receives the feedback voltage signal from the comparator 260 and selects the 10% waveform generator 300 responsive to receiving a logic "1" and the 70% waveform generator 310 responsive to receiving a logic "0". The waveform signals for different channels may be phase shifted relative to one another to avoid driving all the channels simultaneously, thereby reducing emissions.

The compliance voltage controller 200 also includes broken wire detect logic 330 that monitors the feedback signal from the comparator 260. In the event that the load resistance is too high or a wire becomes disconnected, the comparator 260 will continually select the 70% duty cycle signal from the waveform generator 310. The broken wire detect logic 330 includes a flip-flop that is periodically set by the firmware of the programmable logic device and cleared whenever the 10% selection is made. If the flip-flop has remained set just before the periodic action to re-set it, it may be inferred that a 10% selection was not made in the past interval and the compliance voltage controller 200 is attempting to boost the voltage to drive the increased load resistance. The broken wire detect logic 330 may provide a status signal to the controller 110. The controller 110 may implement a variety of actions based on the broken wire status, such as stopping a process, sending an alert email, etc.

Figure 4:
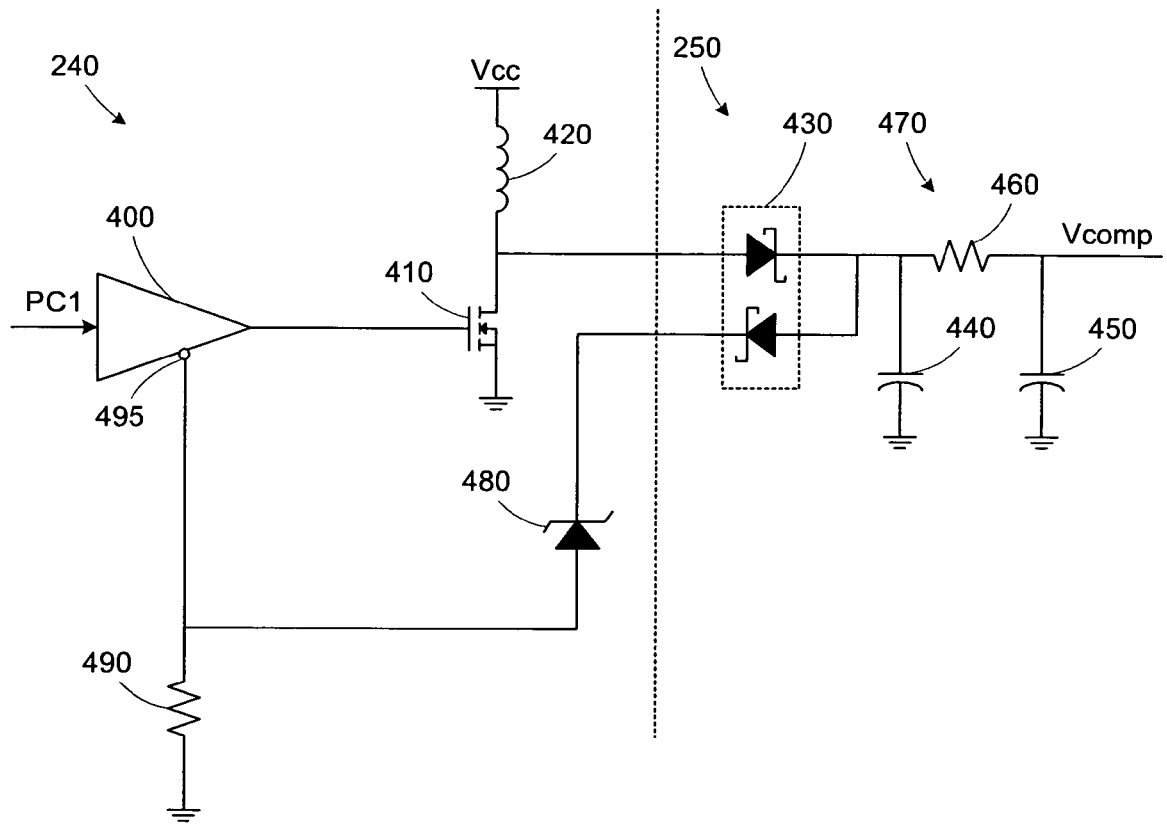
FIG. 4 is a circuit diagram of a boost circuit and a rectifier/filter circuit in the current loop drive module of FIG. 2.

Referring now to FIG. 4, a circuit diagram of one exemplary embodiment of the boost circuit 240 is provided. Other types of boost circuits are known in the art, and the invention is not limited to the particular circuit described herein. The illustrated boost circuit 240 includes a driver 400 that receives the pulse control signal (PC1) from the multiplexer 320 in the compliance voltage controller 200. The driver 400 is connected to the gate input of a transistor 410. An inductor 420 is connected between a voltage supply, Vcc, (e.g., 6V) and the transistor 410. Applying the pulse train to the transistor 410 to periodically isolate the inductor 420 from ground boosts the voltage from the supply voltage, Vcc, to a higher level. The resulting voltage pulses are provided to the rectifier/filter circuit 250 which regulates the boost voltage signal and stores the voltage to generate the compliance voltage. A higher duty cycle waveform applied to the transistor 410 increases the compliance voltage generated in the rectifier/filter circuit 250 and a lower duty cycle waveform applied to the transistor 410 allows the compliance voltage to decay to a lower level. Because the transistor 410 operates in a switching mode when used to control the boost voltage, only a small voltage is dropped across the transistor 410 while it is active, resulting in little heat dissipation.

The rectifier/filter circuit 250 includes a dual diode 430 (e.g., a dual Schottkey diode) that rectifies the boost voltage received from the boost circuit 240. Capacitors 440, 450 and a resistor 460 form an RC filter 470 that generates the compliance voltage, Vcomp, at its output. Of course, other circuit combinations known in the art may be employed to rectify and filter the boost signal to generate the compliance voltage depending on the particular implementation.

A zener diode 480 coupled to the dual diode 430 functions as an overvoltage sensor to generate an overvoltage signal if the compliance voltage exceeds a predetermined value (e.g., such as in the case where the load resistance is too high or a broken wire condition occurs). For example, the zener diode 480 may have a breakdown voltage of 20V to limit the value of Vcomp to 20V. When the voltage at the zener diode 480 exceeds its breakdown voltage, it begins to conduct through a pulldown resistor 490 coupled to an enable input 495 of the driver 400. This voltage turns off the driver 400, thus isolating the boost circuit 240 from the pulse train provided by the compliance voltage controller 200. The compliance voltage then decays until it is less than the breakdown voltage of the zener diode 480, which enables the driver 400 and allows the compliance voltage controller 200 to resume controlling the compliance voltage.

The voltage measured at the dual diode 430 approximates the compliance voltage. Of course the zener diode 480 may be connected at various points within the rectifier/filter circuit 250. If a more direct measurement of the compliance voltage is desired, the zener diode 480 may be connected to the capacitor 450. Also, the breakdown voltage of the zener diode 480 may be adjusted based on the maximum compliance voltage desired.

The current loop drive module 140 of the present invention has numerous advantages. By dynamically adjusting the compliance voltage according to the needs of each load 120, the amount of power dissipated in the current loop drive module 140 is reduced. This reduction allows more channels to be provided in the current loop drive module 140 for a given volume. Another advantage is that the current loop drive module 140 is able to operate the current loop outputs over a wide load range (e.g., 0–750 ohms) with a wide supply range (e.g., 10V–30V) without user consideration. Covering this range without a dynamic compliance voltage, typically requires a user to calculate the total power dissipated in the current loop drive module 140 or the maximum load resistance that could be handled. For example, a user with 20 mA driving 10 ohm loads on 12 outputs using a 28V supply would normally expect to dissipate (~28V×0.02)× 12=6.7 W inside the current loop drive module 140, which does not include the power required by the current loop drive module 140 for operation. Employing the current loop drive module 140 with a dynamic compliance voltage reduces the power dissipated in the current loop drive module 140 to around 1.5 W.

In addition to power management, the user would also be relieved of the need to calculate the amount of load resistance that can be driven under low supply voltage conditions. For example, if the user supply voltage were from a mobile application where the supply voltage is around 10V, the largest current loop load would be about 300 ohms. With the current loop drive module 140 implementing a dynamic compliance voltage, 750 ohm loads could be driven.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. A current loop drive of an industrial control input/output module, comprising:
   a drive circuit configured to receive a compliance voltage and operable to generate a current loop signal based on the compliance voltage for receipt by an associated load coupled to the drive circuit; and
   a compliance voltage controller operable in a switched mode to adjust the compliance voltage supplied to the drive circuit based on a power dissipation in the drive circuit.

2. The module of claim 1, wherein the compliance voltage controller is operable to adjust the compliance voltage based on a voltage measured at the associated load.

3. The module of claim 1, further comprising a transistor coupled between the drive circuit and the load, the transistor having an output providing the current loop signal.

4. The module of claim 3, further comprising a comparator operable to compare a voltage at a gate of the transistor to a voltage at the load to generate a feedback signal, wherein the compliance voltage controller is operable to adjust the compliance voltage based on the feedback signal.

5. The module of claim 4, wherein the compliance voltage controller is operable to decrease the compliance voltage responsive to the voltage at the gate of the transistor being greater than the voltage at the load and increase the compliance voltage responsive to the voltage at the gate of the transistor being less than the voltage at the load.

6. The module of claim 1, further comprising:
a boost circuit coupled to receive a control signal from the compliance voltage controller and operable to boost a supply voltage to generate a boost voltage signal based on the control signal; and
a rectifier/filter circuit coupled to the boost circuit and operable to rectify and filter the boost voltage signal to generate the compliance voltage.

7. The module of claim 6, wherein the boost circuit comprises:
an inductor coupled to the supply voltage; and
a transistor coupled between the inductor and ground and having a gate input coupled to the compliance voltage controller to receive the control signal.

8. The module of claim 7, wherein the compliance voltage controller comprises:
a first waveform generator operable to generate a first signal having a first duty cycle;
a second waveform generator operable to generate a second signal having a second duty cycle greater than the first duty cycle; and
a multiplexer having input terminals coupled to the first and second waveform generators and an output terminal coupled to the gate input of the transistor in the boost circuit.

9. The module of claim 8, further comprising a comparator operable to compare a voltage at a gate of the transistor to a voltage at the load to generate a feedback signal, wherein the multiplexer has a select input coupled to receive the feedback signal.

10. The module of claim 9, wherein the multiplexer is configured to select the first signal from the first waveform generator responsive to the voltage at the gate of the transistor being greater than the voltage at the load and select the second signal from the second waveform generator responsive to the voltage at the gate of the transistor being less than the voltage at the load.

11. The module of claim 8, wherein the first and second signals comprise square waves.

12. The module of claim 6, further comprising an overvoltage sensor coupled to the rectifier/filter circuit to receive the compliance voltage and disable the boost circuit responsive to the compliance voltage exceeding a predetermined threshold.

13. The module of claim 12, wherein the overvoltage sensor comprises a zener diode coupled between the rectifier/filter circuit and an enable input of the boost circuit, the zener diode having a breakdown voltage substantially equal to the predetermined threshold.

14. The module of claim 10, wherein the compliance voltage controller further comprises broken wire detect logic coupled to the comparator and operable to generate a broken wire alert responsive to the comparator not indicating a selection of the first waveform generator through the multiplexer in a predetermined time interval.

15. The module of claim 1, wherein the drive circuit comprises a current mirror circuit.

16. The module of claim 1, wherein the compliance voltage controller operates in a switching mode to adjust the compliance voltage.

17. A current loop drive module, comprising:
a plurality of current loop channels operable to communicate with a plurality of associated loads, each current loop channel including:
a drive circuit configured to receive a compliance voltage and operable to generate a current loop signal for the associated load based on the compliance voltage; and
a compliance voltage controller operable to adjust the compliance voltage for each of the channels based on the load associated with each of the current loop channels and being coupled to a current loop drive circuit to receive the current loop drive signal and provide the adjusted compliance voltage based on a condition of the drive circuit.

18. A current loop drive module, comprising:
a drive circuit configured to receive a compliance voltage and operable to generate a current loop signal based on the compliance voltage for receipt by an associated load coupled to the drive circuit;
a compliance voltage controller operable to generate a control signal based on the associated load to adjust the compliance voltage;
a boost circuit coupled to receive the control signal and operable to boost a supply voltage to generate a boost voltage signal based on the control signal; and
a rectifier/filter circuit coupled to the boost circuit and operable to rectify and filter the boost voltage signal to generate the compliance voltage.

19. A control system, comprising:
a controller operable to generate an output drive signal for controlling each of a plurality of loads;
a drive circuit coupled to more than one of the plurality of loads and configured to receive a compliance voltage, the drive circuit being operable to generate a current loop signal based on the output drive signal using the compliance voltage; and
a compliance voltage controller operable to adjust the compliance voltage based on the a drive circuit power dissipation associated with the respective compliance voltage.

20. A method for generating a current loop signal, comprising:
generating a current loop signal based on a compliance voltage for receipt by an associated load; and
adjusting the compliance voltage communicated to a drive circuit based on a condition of the drive circuit.

21. The method of claim 20, wherein adjusting the compliance voltage further comprises adjusting the compliance voltage based on a comparison of a voltage measured at the associated load and a present compliance voltage.

22. The method of claim 20, further comprising:
generating the current loop drive signal using a current mirror circuit having a transistor;
comparing a voltage at a gate of the transistor to a voltage at the load to generate a feedback signal; and
adjusting the compliance voltage based on the feedback signal.

23. The method of claim 22, wherein adjusting the compliance voltage comprises:
decreasing the compliance voltage responsive to the voltage at the gate of the transistor being greater than the voltage at the load; and
increasing the compliance voltage responsive to the voltage at the gate of the transistor being less than the voltage at the load.

24. The method of claim 22, further comprising:
generating a control signal based on the feedback signal;
boosting a supply voltage based on the control signal to generate a boost voltage signal; and
rectifying and filtering the boost voltage signal to generate the compliance voltage.

25. The method of claim 24, further comprising:
generating a first signal having a first duty cycle;
generating a second signal having a second duty cycle greater than the first duty cycle; and
selecting one of the first and second signals based on the feedback signal to generate the control signal.

26. The method of claim 25, wherein selecting one of the first and second signals further comprises:
selecting the first signal responsive to the voltage at the gate of the transistor being greater than the voltage at the load; and
selecting the second signal from the second waveform generator responsive to the voltage at the gate of the transistor being less than the voltage at the load.

27. The method of claim 25, wherein generating the first and second signals comprises generating square waves.

28. The method of claim 24, further comprising inhibiting the generating of the boost voltage signal responsive to the compliance voltage exceeding a predetermined threshold.

29. The method of claim 26, further comprising generating a broken wire alert responsive to not selecting the first signal within a predetermined time interval.

30. The method of claim 20, wherein adjusting the compliance voltage further comprises adjusting compliance voltage in a circuit without dissipating a significant amount of heat in the circuit.

31. A drive module comprising a drive circuit for generating a current loop signal for a load based on a data input signal indicative of a condition of the drive circuit and a voltage-controllable drive circuit operating in a switching mode to adjust voltage applied to the load as a function of the load and the data input signal.

32. The module of claim 31, wherein the voltage-controllable drive circuit is operable to adjust voltage applied to the load as a function a voltage measured at the load.

* * * * *